United States Patent
Feng (10) Patent No.: US 10,559,266 B2
(45) Date of Patent: Feb. 11, 2020

(54) PIXEL DRIVING METHOD, PIXEL DRIVING AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/159,036

(22) Filed: Oct. 12, 2018

(65) Prior Publication Data
US 2019/0114972 A1    Apr. 18, 2019

(30) Foreign Application Priority Data

Oct. 16, 2017 (CN) .......................... 2017 1 0961681

(51) Int. Cl.
*G09G 3/3291* (2016.01)
*G09G 3/3283* (2016.01)
(Continued)

(52) U.S. Cl.
CPC ......... *G09G 3/3291* (2013.01); *G09G 3/3233* (2013.01); *G09G 3/3283* (2013.01); *H01L 27/3244* (2013.01); *G09G 2300/043* (2013.01)

(58) Field of Classification Search
CPC .. G09G 3/3233; G09G 3/3258; G09G 3/3283; G09G 3/3291; G09G 2300/043;
(Continued)

(56) References Cited

U.S. PATENT DOCUMENTS

| 8,866,705 B2 | 10/2014 | Takasugi et al. |
| 2011/0285691 A1* | 11/2011 | Takasugi ............... G09G 3/3233 345/212 |
| 2016/0189635 A1* | 6/2016 | Lee ....................... G09G 3/3233 345/690 |

FOREIGN PATENT DOCUMENTS

| CN | 102254510 A | 11/2011 |
| CN | 106782333 A | 5/2017 |

(Continued)

OTHER PUBLICATIONS

Office Action dated Apr. 29, 2019 issued in corresponding in Chinese Application No. 201710961681.1.

*Primary Examiner* — Stacy Khoo
(74) *Attorney, Agent, or Firm* — Nath, Goldberg & Meyer; Joshua B. Goldberg (57) ABSTRACT

The application provides pixel driving method, pixel driving device and display apparatus. The method is used for driving light emission of light emitting element in duration of image frame in display panel, the duration of image frame including display driving period and stable display period which are consecutive. The method includes: receiving first data voltage for image display in display driving period of current image frame to generate driving current through driving transistor for driving light emission of the light emitting element; receiving second data voltage for detection and first reference voltage in stable display period of current image frame to detect threshold voltage of the driving transistor; adjusting first reference voltage to generate second reference voltage in display driving period of next image frame, generating driving current for driving light emission of the light emitting element based on second reference voltage.

16 Claims, 4 Drawing Sheets

(51) Int. Cl.
*H01L 27/32* (2006.01)
*G09G 3/3233* (2016.01)
(58) Field of Classification Search
CPC ... G09G 2300/0819; G09G 2300/0842; G09G 2320/0233; G09G 2320/0295; G09G 2320/045; H01L 27/3244
See application file for complete search history.

(56) References Cited

FOREIGN PATENT DOCUMENTS

| | | | |
|---|---|---|---|
| CN | 107093403 | A | 8/2017 |
| KR | 10-2017-0049241 | A | 5/2017 |
| KR | 10-2017-0081056 | A | 7/2017 |

* cited by examiner

PIXEL DRIVING METHOD, PIXEL DRIVING AND DISPLAY APPARATUS

CROSS-REFERENCE TO RELATED APPLICATION

This application claims priority to Chinese Patent Application No. 201710961681.1, filed on Oct. 16, 2017, the entire contents of which are hereby incorporated by reference.

TECHNICAL FIELD

The present disclosure relates to the field of display technology, and more particularly, to a pixel driving method, a pixel driving device and a display apparatus.

BACKGROUND

Organic Light Emitting Diode (OLED) display has many advantages including wider view angles, greater brightness, higher contrast, lower power consumption, thinner physical thickness over many conventional display technologies. Low Temperature Poly Silicon (LTPS) substrate with its fast electron mobility characteristics has become a popular substrate for making thin-film-transistors-based pixel driving circuit for driving light emission of each OLED associated with each sub-pixel in the display panel. In real OLED display apparatus, every thin-film transistor formed in the display panel may not have uniform characteristics in threshold voltage, carrier mobility, or resistor series, leading to non-uniform variations in image display across the display panel.

SUMMARY

In an aspect, the present disclosure provides a pixel driving method for driving light emission of a light emitting element in duration of an image frame in a display panel, the duration of the image frame including a display driving period and a stable display period which are consecutive. The method includes: receiving a first data voltage for image display in a display driving period of a current image frame to generate a driving current, through a driving transistor, for driving light emission of the light emitting element; receiving a second data voltage for detection and a first reference voltage in a stable display period of the current image frame to detect a threshold voltage of the driving transistor; and in a display driving period of a next image frame, adjusting the first reference voltage to generate a second reference voltage, and generating a driving current for driving light emission of the light emitting element based on the second reference voltage.

In some embodiments, the threshold voltage of the driving transistor negatively drifts, the first reference voltage has a positive value, and the second reference voltage is less than the first reference voltage and greater than 0.

In some embodiments, adjusting the first reference voltage to generate a second reference voltage in a display driving period of a next image frame includes: receiving a third data voltage for image display, and adjusting the first reference voltage based on the third data voltage to generate the second reference voltage.

In some embodiments, receiving a second data voltage for detection and a first reference voltage in a stable display period of the current image frame to detect a threshold voltage of the driving transistor includes storing a value of the first reference voltage; and receiving a third data voltage for image display and adjusting the first reference voltage based on the third data voltage to generate the second reference voltage includes: adjusting the first reference voltage based on the third data voltage and the stored value of the first reference voltage, to generate the second reference voltage.

In some embodiments, the second reference voltage decreases as the third data voltage increases.

In some embodiments, the method further includes: selecting one function among a plurality of preset functions based on the stored value of the first reference voltage, and adjusting the first reference voltage based on the third data voltage and the one function to generate the second reference voltage.

In some embodiments, the light emitting element is an organic light emitting diode, and the display panel is an organic light emitting diode display panel.

In another aspect, the present disclosure further provides a pixel driving device including a driving transistor, a driving and compensation circuit and a detection circuit. A source electrode of the driving transistor is coupled to an anode of a light emitting element and the detection circuit, a gate electrode and the source electrode of the driving transistor is coupled to the driving and compensation circuit, and a drain electrode of the driving transistor is coupled to a high voltage level terminal. A cathode of the light emitting element is coupled to a low voltage level terminal. The driving and compensation circuit is configured to drive light emission of the light emitting element under drive of a data voltage and to compensate for a threshold to voltage of the driving transistor. The detection circuit is configured to detect a value of the threshold voltage based on a reference voltage. The pixel driving device further includes a reference voltage adjustment circuit coupled to the detection circuit and configured to adjust the reference voltage to generate a second reference voltage such that the driving and compensation circuit generates a driving current for driving light emission of the light emitting element based on the second reference voltage.

In some embodiments, the threshold voltage of the driving transistor negatively drifts, the reference voltage has a positive value, and the second reference voltage is less than the reference voltage and greater than 0.

In some embodiments, the reference voltage adjustment circuit includes an adjustment sub-circuit configured to receive the data voltage and adjust the reference voltage based on the data voltage to generate the second reference voltage.

In some embodiments, the reference voltage adjustment circuit further includes a storage configured to store a value of the reference voltage; and the adjustment sub-circuit is configured to adjust the reference voltage based on the stored value of the reference voltage and the data voltage, to generate the second reference voltage.

In some embodiments, the second reference voltage decreases as the data voltage increases.

In some embodiments, the reference voltage adjustment circuit further includes a selecting sub-circuit configured to select one function among a plurality of preset functions based on the stored value of the reference voltage, and the adjustment sub-circuit is configured to adjust the reference voltage based on the data voltage and the one function to generate the second reference voltage.

In some embodiments, the light emitting element is an organic light emitting diode.

In another aspect, the present disclosure further provides a display apparatus including any one of the pixel driving devices described herein.

In some embodiments, the display apparatus is an organic light emitting diode display apparatus.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the field of display technology, particularly in organic light emitting diode (OLED) display panels, the compensation circuit in a pixel circuit is very important. The threshold voltage of a driving transistor in the pixel circuit cannot be stable at a certain value due to the instability of processes and external interferences. As a result, a drift of the threshold voltage of the driving transistor may occur, which is required to be compensated for by using the compensation circuit.

A negative drift of the threshold voltage of the driving transistor sometimes occurs. As such, a reference voltage in the compensation circuit for detecting the threshold voltage of the driving transistor is required to be boosted to have a positive value in order to detect the specific value of the threshold voltage of the driving transistor. Generally, the reference voltage is not changed thereafter.

However, in a case where the negative drift value of the threshold voltage is to relatively large, a large reference voltage is required, resulting in that the maximum display brightness of the OLED display panel decreases and the brightness range is narrower.

Accordingly, the present disclosure provides, inter alia, a pixel driving method, a pixel driving device and a display apparatus that substantially obviate one or more of the problems due to limitations and disadvantages of the related art.

Figure 1:
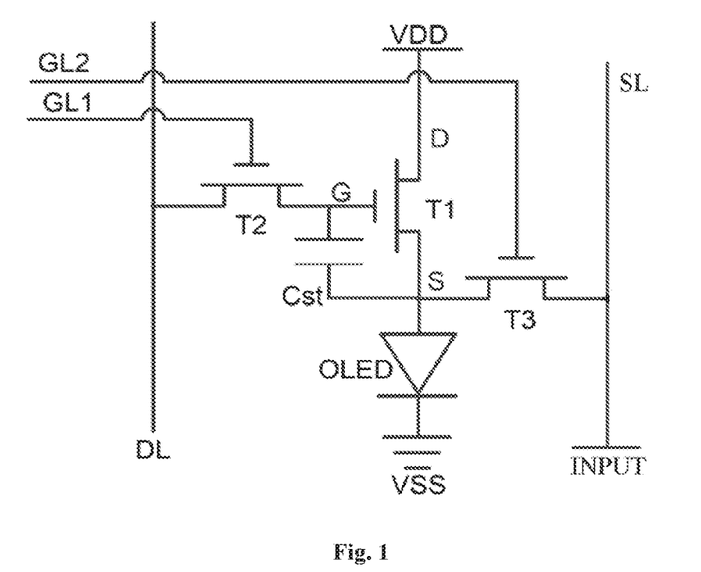
FIG. 1 is a diagram illustrating a basic structure of a pixel circuit in embodiments of the present disclosure.

FIG. 1 is a diagram illustrating a basic structure of a pixel circuit in embodiments of the present disclosure. As illustrated in FIG. 1, the pixel circuit includes a driving transistor T1, a switch transistor T2 and a light emitting element (shown as an organic light emitting diode OLED in the drawings by way of example). A cathode of the OLED is coupled to a low voltage level terminal VSS and an anode of the OLED is coupled to a source electrode S of the driving transistor T1. A drain electrode D of the driving transistor T1 is coupled to a high voltage level VDD, and a gate electrode G of the driving transistor T1 is coupled to a first electrode of the switch transistor T2. A control electrode of the switch transistor T2 is coupled to a first scan line GL1, and a second electrode of the switch transistor T2 is coupled to a data line DL. The first scan line GL1 is configured to control an ON/OFF state of the switch transistor T2. The data line DL is configured to transmit a data voltage Vdata. A storage capacitor Cst is connected between the first electrode of the switch transistor T2 and the source electrode S of the driving transistor T1.

The pixel circuit may further include a sensing transistor T3 for detecting a threshold voltage of the driving transistor T1. A first electrode of the sensing transistor T3 is coupled to the source electrode S of the driving transistor T1, a control electrode of the sensing transistor T3 is coupled to a second scan line GL2, and a second electrode of the sensing transistor T3 is coupled to a sensing line SL to output a detection result through the sensing line SL to an external circuit for further processing. The second scan line GL2 is configured to control an ON/OFF state of the sensing transistor T3.

In the above circuit configuration, the driving transistor T1 is an N type transistor, and each of the switch transistor T2 and the sensing transistor T3 is a P type transistor. However, the present disclosure is not limited thereto, and each of the switch transistor T2 and the sensing transistor T3 may also be an N type transistor.

The pixel circuit further includes an input terminal INPUT configured to receive externally input reference voltage Vref.

Figure 2:
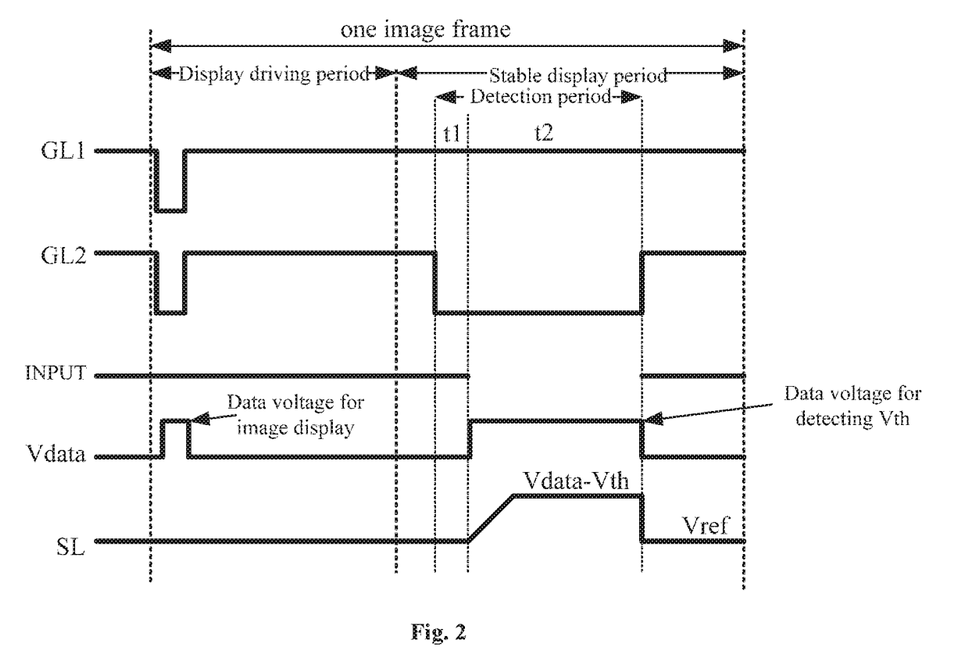
FIG. 2 is a timing diagram of the pixel circuit in FIG. 1.

FIG. 2 is a timing diagram of the pixel circuit in FIG. 1. Next, operations of the pixel circuit will be described with reference to FIGS. 1 and 2.

As illustrated in FIG. 2, duration of an image frame in a display panel may be divided into a display driving period and a stable display period. In order to realize detection of a threshold voltage Vth of the driving transistor T1 in the pixel circuit, a time period within the stable display period is taken for detecting the threshold voltage Vth of each of the driving transistors in a row of pixels.

With respect to the pixel circuit in FIG. 1, operations of the pixel circuit can be divided into two periods: a driving period and a detection period.

The driving period corresponds to a time period in which the first scan line GL1 is in a low level. In this time period, a data voltage Vdata for image display is written into the gate electrode G of the driving transistor T1, and the driving transistor T1 outputs a driving current for driving the OLED to display.

The detection period is divided into a resetting sub-period t1 and a threshold voltage detection sub-period t2.

During the sub-period t1, the input terminal INPUT receives a reference voltage Vref, the second scan line GL2 is in a low level, the sensing transistor T3 is turned on, and voltage levels of the source electrode S of the driving transistor T1 and the sensing line SL are reset to the reference voltage Vref.

During the sub-period t2, the sensing transistor T3 keeps ON, the input terminal INPUT stops receiving the reference voltage Vref, and the data line DL is supplied with a data voltage Vdata (having a predetermined value) for detecting the threshold voltage Vth. As such, the driving transistor T1 is turned on, the high voltage level charges the source electrode S and the sensing line SL through the driving transistor T1, until the voltage level in the sensing line SL (and the source electrode S) changes to Vdata−Vth. At this time, the gate-source voltage Vgs of the driving transistor T1 is Vgs=Vg−Vs=Vdata−(Vdata−Vth)=Vth, and the driving transistor T1 is turned off. The voltage level in the sensing line SL is stabilized at Vdata−Vth.

After that, the voltage level in the sensing line SL. i.e., Vdata-Vth, may be detected by an external circuit (e.g., a sensing chip). Because the data voltage for detecting the threshold voltage Vth is known, the threshold voltage Vth of the driving transistor T1 can be calculated. Then, the drift of the threshold voltage Vth of the driving transistor T1 can be compensated for by an algorithm.

As discussed above, a negative drift of the threshold voltage Vth of the driving transistor T1 sometimes occurs. Therefore, the reference voltage Vref is required to be boosted to have a positive value in order to detect the specific value of the threshold voltage Vth of the driving transistor T1. In the related art, the reference voltage Vref is generally not changed thereafter.

However, when the negative drift of the threshold voltage Vth of the driving transistor T1 is severe, the reference voltage Vref is required to be boosted to have a large positive value to detect the specific value of the threshold voltage Vth. Further, since the reference voltage Vref is not changed after the detection in the related art, an actual display brightness of a high brightness image cannot reach a required brightness when the OLED display panel displays the high brightness image, resulting in a narrower brightness range of the OLED display panel. The reason is as follows: in the display driving period of the OLED display panel, the gate-source voltage Vgs of the driving transistor T1 is equal to the display brightness voltage (i.e., the data voltage Vdata) minus the reference voltage Vref; however, as illustrated in FIG. 1, the drain electrode D of the driving transistor T1 is coupled to the high voltage level terminal VDD, and the voltage level input from the high voltage level terminal VDD generally has a fixed value; therefore, the source-drain voltage Vds (i.e., the difference between the voltage at the drain electrode of the driving transistor T1 and the voltage at the source electrode thereof) decreases as the reference voltage Vref increases; as a result, the driving transistor T1 may enter the linear region such that the driving current output from the driving transistor T1 decreases and the actual display brightness of the OLED lowers. On the other hand, in order to ensure the source-drain voltage Vds of the driving transistor T1 meets requirements, the reference voltage Vref cannot be set to be excessively large, which in turn affects detection range for the threshold voltage Vth of the driving transistor T1.

Figure 3:
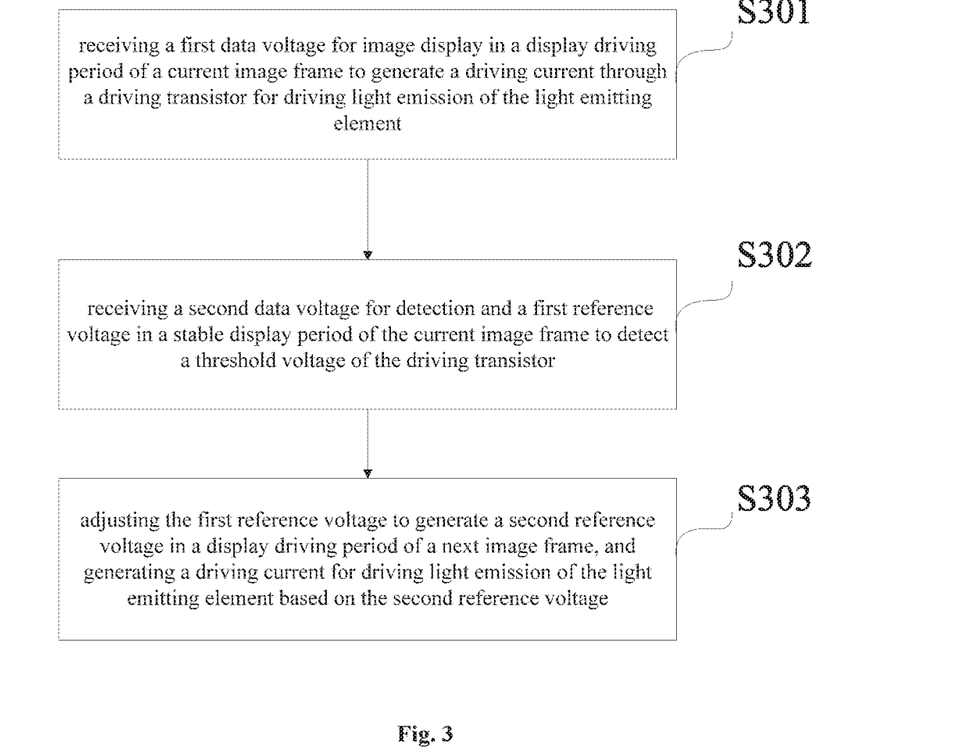
FIG. 3 is a flowchart illustrating a pixel driving method in some embodiments of the present disclosure.

FIG. 3 is a flowchart illustrating a pixel driving method in some embodiments of the present disclosure. The pixel driving method is used for driving light emission of a light emitting element in duration of an image frame in a display panel, the duration of the image frame including a display driving period and a stable display period (e.g., as illustrated in FIG. 2) which are consecutive. As illustrated in FIG. 3, the method in some embodiments includes: step S301, receiving a first data voltage for image display in a display driving period of a current image frame to generate a driving current through a driving transistor for driving light emission of the light emitting element; and step S302, receiving a second data voltage for detection and a first reference voltage in a stable display period of the current image frame to detect a threshold voltage of the driving transistor.

The above steps S301 and S302 are substantially the same as steps of detecting the threshold voltage described above with reference to FIGS. 1 and 2, which will not be described here.

As illustrated in FIG. 3, the method further includes: step S303, adjusting the first reference voltage to generate a second reference voltage in a display driving period of a next image frame, and generating a driving current for driving light emission of the light emitting element based on the second reference voltage.

In the embodiments of the present disclosure, the light emitting element may be an organic light emitting diode, and the display panel may be an organic light emitting diode display panel.

As discussed above and in the related art, the reference voltage Vref is set and it is not changed thereafter, resulting in a problem that an actual display brightness of a high brightness image cannot reach a required brightness when the OLED display panel displays the high brightness image and thereby the brightness range of the OLED display panel is narrower. According to the embodiments of the present disclosure, however, the first reference voltage is adjusted to generate the second reference voltage, and the driving current is generated based on the second reference voltage, such that the use of a fixed reference voltage is avoided, which in turn can avoid the problem that the actual display brightness of the OLED display panel cannot meet the requirement.

In some embodiments, the threshold voltage of the driving transistor negatively drifts, the first reference voltage has a positive value, and the second reference voltage is less than the first reference voltage and greater than 0.

According to the embodiments of the present disclosure, the threshold voltage of the driving transistor is detected in the stable display period by using the first reference voltage, the first reference voltage is adjusted to generate the second reference voltage in the display driving period, and the second reference voltage is less than the first reference voltage. As such, when the first reference voltage is set to have a large positive value in consideration of severe negative drift of the threshold voltage of the driving transistor, the actual display brightness can reach the required brightness when the OLED display panel displays the high brightness image due to the reduced reference voltage (i.e., the second reference voltage), such that the brightness range of the OLED display panel is wider.

Moreover, according to the embodiments of the present disclosure, since the first reference voltage for detecting the threshold voltage of the driving transistor is independent from the driving current from the driving transistor, the first reference voltage can be set as required to detect the threshold voltage of the driving transistor, thereby increasing the detection range for the threshold voltage.

In some embodiments, adjusting the first reference voltage to generate a second reference voltage in a display driving period of a next image frame includes: receiving a third data voltage for image display, and adjusting the first reference voltage based on the third data voltage to generate the second reference voltage.

In some embodiments, receiving a second data voltage for detection and a first reference voltage in a stable display period of the current image frame to detect a threshold voltage of the driving transistor includes storing a value of the first reference voltage; and receiving a third data voltage for image display and adjusting the first reference voltage to generate the second reference voltage based on the third data voltage includes: adjusting the first reference voltage based on the third data voltage and the stored value of the first reference voltage, to generate the second reference voltage.

In some embodiments, the second reference voltage decreases as the third data voltage increases.

Those skilled in the art should understand that, according to an output current curve of the driving transistor T1 in the saturation region and that in the linear region, the driving current output from the driving transistor T1 operating in the saturation region is larger than the driving current output from the driving transistor T1 operating in the linear region, with respect to a same gate-source voltage Vgs. Referring to FIG. 1, in order to ensure that the driving transistor T1 operates in the saturation region, a condition of Vds≥Vgs−Vth should be satisfied, where Vds is the source-drain voltage of the driving transistor T1, Vgs is the gate-source voltage of the driving transistor T1, and Vth is the threshold voltage of the driving transistor T1. As discussed above, the condition may not be satisfied due to the decreased source-drain voltage Vds in the related art, resulting in that the driving transistor T1 enters the linear region, the driving current decreases and the maximum brightness of the display panel is substandard. To address such a problem, in some embodiments of the present disclosure, the reference voltage is not fixed at a certain value, and is set to be a variable voltage.

Figure 4:
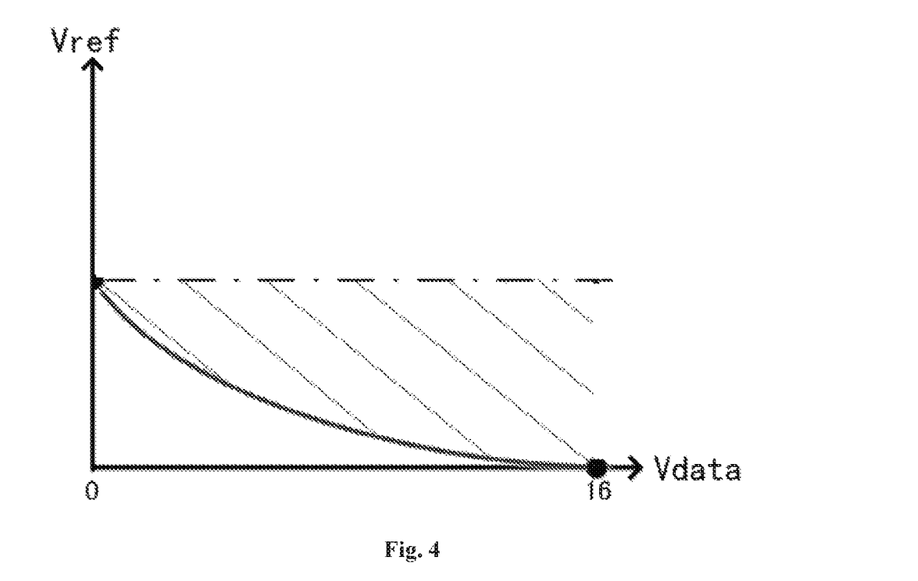
FIGS. 4 and 5 illustrate two examples in which a reference voltage varies as a data voltage varies.
Figure 5:
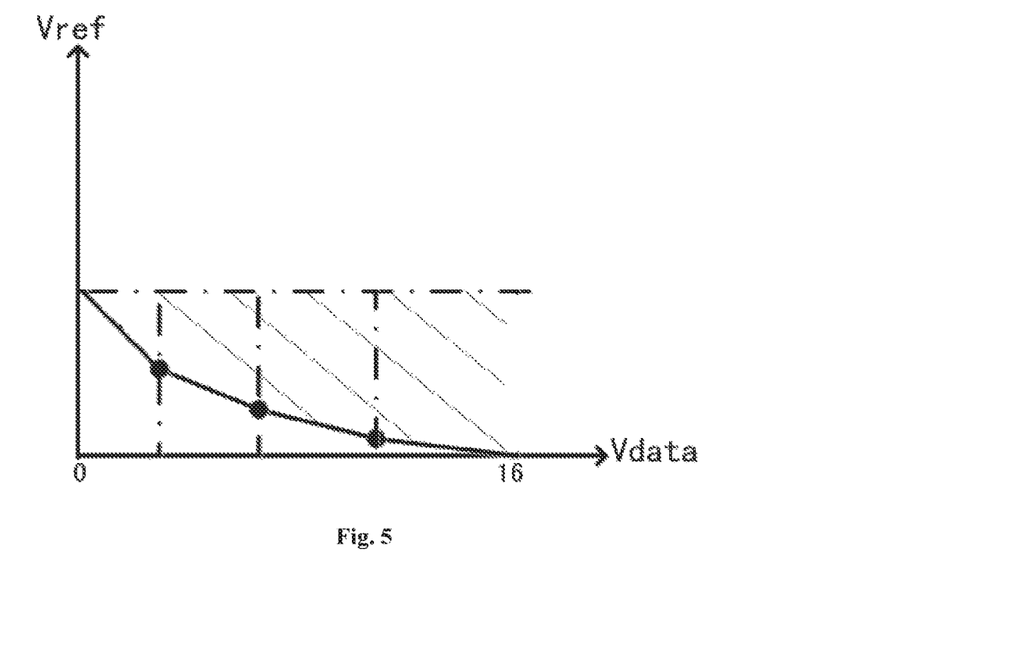

In some embodiments of the present disclosure, the reference voltage Vref (i.e., the second reference voltage) is set to have a large positive value in a case of lower brightness (i.e., in a case where the value of the third data voltage Vdata is relatively small). As the data voltage (i.e., the third data voltage) Vdata increases, the reference voltage Vref (i.e., the second reference voltage) is adjusted to have a lower value, so as to ensure that the driving transistor always operates in the saturation region, the driving current for pixel does not decrease, and the brightness of the display panel does not decrease. FIGS. 4 and 5 illustrate two examples in which the reference voltage Vref (i.e., the second reference voltage) varies as the data voltage varies. As illustrated to in FIG. 4, the reference voltage varies in a form of a curve. As illustrated in FIG. 5, the reference voltage varies in a form of a segmented function.

In the embodiments of the present disclosure, different functions corresponding to different first reference voltages may be stored in advance, and a corresponding function is selected according to the stored value of the first reference voltage.

Accordingly, in some embodiments of the present disclosure, the method further includes: selecting one function among a plurality of preset functions based on the stored value of the first reference voltage, and adjusting the first reference voltage based on the third data voltage and the one function to generate the second reference voltage. Here, the preset functions may be functions that are set in advance according to characteristic values of the driving transistor, but the present disclosure is not limited thereto as long as the adjusted reference voltage based on the preset functions does not affect the display brightness of the OLED.

In the embodiments of the present disclosure, each of the first data voltage, the second data voltage and the third data voltage is a data voltage input through a data line (e.g., the data line DL in FIG. 1), where the first data voltage and the third data voltage, which are for image display, may be ranged from 0 to 16V, and the value of second data voltage for detection may be determined according to actual needs.

In the embodiments of the present disclosure, the reference voltage is not fixed as the reference voltage for detecting the threshold voltage, but is adjusted so as not to affect normal display brightness of the light emitting element. Meanwhile, since the reference voltage is adjusted and does not affect the normal display brightness of the light emitting element, a relatively large value of the reference voltage can be selected in the detection of the threshold voltage of the driving transistor, thereby increasing the detection range for the threshold voltage.

Figure 6:
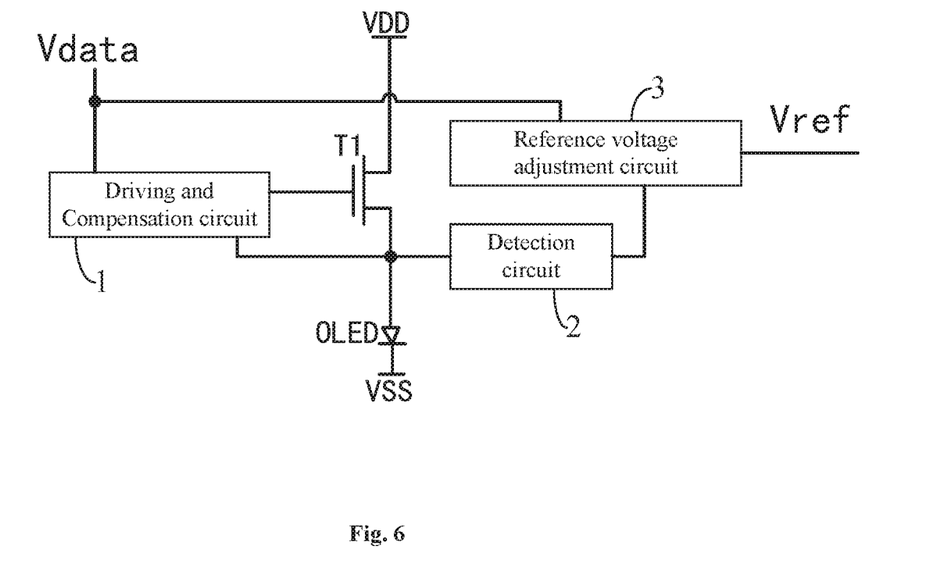
FIG. 6 is a schematic circuit diagram of a pixel driving device according to some embodiments of the present disclosure.

FIG. 6 is a schematic circuit diagram of a pixel driving device in some embodiments of the present disclosure. As illustrated in FIG. 6, the pixel driving device includes a driving transistor T1, a driving and compensation circuit 1 and a detection circuit 2. A source electrode of the driving transistor T1 is coupled to an anode of a light emitting element (shown as organic light emitting diode OLED in the drawings), a gate electrode and the source electrode of the driving transistor T1 is coupled to the driving and compensation circuit 1, and a drain electrode of the driving transistor T1 is coupled to a high voltage level terminal VDD. A cathode of the OLED is coupled to a low voltage level terminal VSS.

The driving and compensation circuit 1 may include a switch transistor and a storage capacitor. For example, as illustrated in FIG. 1, the driving and compensation circuit 1 may include the switch transistor T2 and the storage capacitor Cst. The driving and compensation circuit 1 is configured to drive light emission of the light emitting element under drive of a data voltage Vdata and to compensate for a threshold voltage of the driving transistor T1. Needless to say, the present disclosure is not limited thereto, and other driving and compensation circuits may be employed in the present disclosure.

The detection circuit 2 may include a sensing transistor. For example, as illustrated in FIG. 1, the detection circuit 2 may include the sensing transistor T3, and is configured to detect a value of the threshold voltage of the driving transistor T1 based on a reference voltage Vref, and to output a detect result through the sensing line SL to an external circuit for further processing.

The pixel driving device further includes a reference voltage adjustment circuit 3, which is coupled to the detection circuit 2 and is configured to adjust the reference voltage to generate a second reference voltage, such that the driving and compensation circuit generates a driving current for driving light emission of the light emitting element based on the second reference voltage.

As discussed above and in the related art, the reference voltage Vref is set and is not changed thereafter, resulting in a problem that an actual display brightness of a high brightness image cannot reach a required brightness when the OLED display panel displays the high brightness image and thereby the brightness range of the OLED display panel is narrower. According to the embodiments of the present disclosure, however, the reference voltage is adjusted to generate the second reference voltage, and the driving current is generated by the driving and compensation circuit based on the second reference voltage, such that the use of a fixed reference voltage is avoided, which in turn can avoid the problem that the actual display brightness of the OLED display panel cannot meet the requirement.

In some embodiments, the threshold voltage of the driving transistor negatively drifts, the reference voltage has a positive value, and the second reference voltage is less than the reference voltage and greater than 0.

According to embodiments of the present disclosure, by having the detection circuit, the threshold voltage of the driving transistor is detected by using the reference voltage, the reference voltage is adjusted by the reference voltage adjustment circuit to generate the second reference voltage, and the second reference voltage is less than the reference voltage. As such, when the reference voltage is set to have a large positive value in consideration of severe negative drift of the threshold voltage of the driving transistor, the actual display brightness can reach the required brightness when the OLED display panel displays the high brightness image due to the reduced reference voltage (i.e., the second reference voltage), such that the brightness range of the OLED display panel is wider.

Moreover, according to the embodiments of the present disclosure, since the reference voltage for detecting the threshold voltage of the driving transistor is independent from the driving current, the reference voltage can be set as required to detect the threshold voltage of the driving transistor, thereby increasing the detection range for the threshold voltage.

Here, it should be noted that the reference voltage adjustment circuit may not adjust the input reference voltage (i.e., the reference voltage Vref for detecting the threshold voltage) in the detection period, but passes the same to the detection circuit directly.

Figure 7:
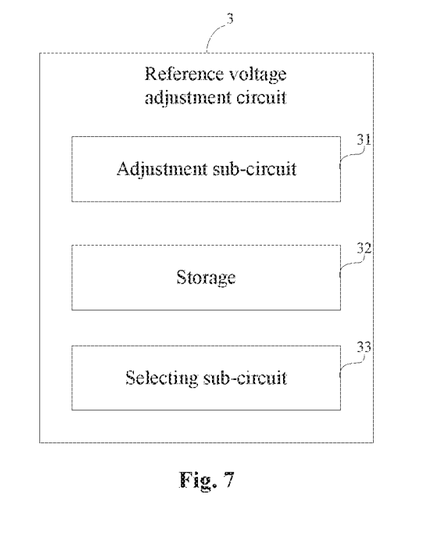
FIG. 7 is a schematic diagram illustrating a structure of a reference voltage adjustment circuit in FIG. 6.

FIG. 7 is a schematic diagram illustrating an exemplary structure of the reference voltage adjustment circuit in FIG. 6.

As illustrate in FIG. 7, the reference voltage adjustment circuit 3 in some embodiments includes an adjustment sub-circuit 31 configured to receive the data voltage for image display and adjust the reference voltage based on the data voltage to generate the second reference voltage, so as to output the second reference voltage to the detection circuit (and further to the source electrode of the driving transistor T1).

As illustrated in FIG. 7, the reference voltage adjustment circuit 3 in some embodiments further includes a storage 32 configured to store a value of the reference voltage; and the adjustment sub-circuit 31 is configured to adjust the reference voltage based on the stored value of the reference voltage and the data voltage for image display, to generate the second reference voltage.

In some embodiments, the second reference voltage decreases as the data voltage increases.

Those skilled in the art should understand that, according to the output current curve of the driving transistor T1 in the saturation region and that in the linear region, the driving current output from the driving transistor T1 operating in the saturation region is larger than the driving current output from the driving transistor T1 operating in the linear region, with respect to a same gate-source voltage Vgs. Referring to FIG. 1, in order to ensure that the driving transistor T1 operates in the saturation region, a condition of Vds≥Vgs−Vth should be ensured, where Vds is the source-drain voltage of the driving transistor T1, Vgs is the gate-source voltage of the driving transistor T1, and Vth is the threshold voltage of the driving transistor T1. As discussed above, the condition may not be satisfied due to the decreased source-drain voltage Vds in the related art, resulting in that the driving transistor T1 enters the linear region, the driving current decreases and the maximum brightness of the display panel is substandard. To address such a problem, in some embodiments of the present disclosure, the reference voltage is not fixed at a certain value, but set to be a variable voltage.

In some embodiments of the present disclosure, the reference voltage Vref (i.e., the second reference voltage) is set to have a large positive value through the adjustment sub-circuit in a case of lower brightness (i.e., in a case where the value of the data voltage Vdata for image display is relatively small). As the data voltage (i.e., the data voltage for image display) Vdata increases, the reference voltage Vref (i.e., the second reference voltage) is adjusted through the adjustment sub-circuit to have a lower value, so as to ensure that the driving transistor always operates in the to saturation region, the driving current for pixel (or sub-pixel) does not decrease, and the brightness of the display panel does not decrease.

In the embodiments of the present disclosure, different functions corresponding to different reference voltages may be stored in advance in the storage 32 of the reference voltage adjustment circuit 3, and a corresponding function is selected according to the stored value of the reference voltage.

Accordingly, in some embodiments of the present disclosure, the reference voltage adjustment circuit 3 further includes a selecting sub-circuit 33 configured to select one function among a plurality of preset functions based on the stored value of the reference voltage, and the adjustment sub-circuit 31 is configured to adjust the reference voltage based on the data voltage and the one function to generate the second reference voltage.

In the embodiments of the present disclosure, the reference voltage is not fixed as the reference voltage for detecting the threshold voltage, but is adjusted so as not to affect normal display brightness of the light emitting element. Meanwhile, since the reference voltage is adjusted and does not affect the normal display brightness of the light emitting element, the reference voltage having a relatively large value can be selected in the detection of the threshold voltage of the driving transistor, thereby increasing the detection range for the threshold voltage.

Embodiments of the present disclosure further provide a display apparatus, which includes the pixel driving device in the above embodiments.

By having the pixel driving device in the above embodiments, the display brightness of the display apparatus is not lowered, and the brightness range of the display apparatus is increased.

The display apparatus provided by the present disclosure may be any product or component having display function, such as an OLED display panel, an OLED television, a monitor, a mobile phone, a navigator or the like.

Portions of the present disclosure may be implemented in hardware, software, firmware, or a combination thereof. In the above embodiments, a plurality of steps or methods may be implemented using software or firmware stored in a memory and executed by a suitable instruction execution system. For example, if implemented in hardware, as in another embodiment, it can be implemented using any one or a combination of the following techniques known in the art: discrete logic circuit having logic gate circuits for implementing logic functions on data signals, Central Processing Units (CPUs), Digital Processors (DSPs), Application Specific Integrated Circuits (ASICs), Programmable Gate Arrays (PGAs). Field Programmable Gate Arrays (FPGAs), etc. with suitable combinational logic gate circuits.

In addition, each functional unit in each embodiment of the present disclosure may be integrated in one processing module, or each unit may exist alone physically, or two or more units may be integrated in one module. The above integrated module can be implemented in the form of hardware or in the form of a software function module. The integrated module can also be stored in a computer readable storage medium if it is implemented in the form of a software functional module and sold or used as an independent product.

In the description of the present specification, the description referring to the terms "tone embodiment", "some embodiments", "an example", "a specific example", "some examples" or the like means specific features, structures, materials, or features described in conjunction with the embodiment or example are included in at least one embodiment or example of the present disclosure. In this specification, the schematic representation of the above terms does not necessarily have to refer to the same embodiment or example. Furthermore, the specific features, structures, materials, or features described may be combined in any suitable manner in any one or more of the embodiments or examples. In addition, those skilled in the art may combine and incorporate different embodiments or examples and features thereof described in this specification without conflicting with each other.

Furthermore, the terms "first", "second" and the like are used for descriptive purposes only, and are not to be construed as indicating or implying relative importance or implicitly indicating the number of indicated technical features. Thus, features defined as "first", "second" and the like may explicitly or implicitly include at least one such feature. In the description of the present disclosure, the meaning of "plurality" is at least two, for example, two, three, etc., unless specifically defined otherwise.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises", "comprising", "includes", and/or "including", if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the present disclosure pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of", when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between", "adjacent" versus "directly adjacent", "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present disclosure has been particularly shown and described with reference to embodiments thereof, it will be understood that various changes in form and details may be made therein without departing from the spirit and scope of the following claims.

What is claimed is:

1. A pixel driving method, which is used for driving light emission of a light emitting element in duration of an image frame in a display panel, the duration of the image frame comprising a display driving period and a stable display period which are consecutive, the method comprising:
   receiving a first data voltage for image display in a display driving period of a current image frame to generate a driving current through a driving transistor for driving light emission of the light emitting element;
   receiving a second data voltage for detection and a first reference voltage in a stable display period of the current image frame to detect a threshold voltage of the driving transistor; and
   in a display driving period of a next image frame, adjusting the first reference voltage to generate a second reference voltage, and generating a driving current for driving light emission of the light emitting element based on the second reference voltage.

2. The method of claim 1, wherein the threshold voltage of the driving transistor negatively drifts, the first reference voltage has a positive value, and the second reference voltage is less than the first reference voltage and greater than 0.

3. The method of claim 1, wherein adjusting the first reference voltage to generate a second reference voltage in a display driving period of a next image frame comprises:
   receiving a third data voltage for image display, and adjusting the first reference voltage based on the third data voltage to generate the second reference voltage.

4. The method of claim 3, wherein receiving a second data voltage for detection and a first reference voltage in a stable display period of the current image frame to detect a threshold voltage of the driving transistor comprises storing a value of the first reference voltage; and
   receiving a third data voltage for image display, and adjusting the first reference voltage based on the third data voltage to generate the second reference voltage comprises: adjusting the first reference voltage based on the third data voltage and the stored value of the first reference voltage, to generate the second reference voltage.

5. The method of claim 4, wherein the second reference voltage decreases as the third data voltage increases.

6. The method of claim 4, further comprising: selecting one function among a plurality of preset functions based on the stored value of the first reference voltage, and adjusting the first reference voltage based on the third data voltage and the one function to generate the second reference voltage.

7. The method of claim 1, wherein the light emitting element is an organic light emitting diode, and the display panel is an organic light emitting diode display panel.

8. A pixel driving device, comprising a driving transistor, a driving and compensation circuit and a detection circuit, a source electrode of the driving transistor being coupled to an anode of a light emitting element and the detection circuit, a gate electrode and the source electrode of the driving transistor being coupled to the driving and compensation circuit, a drain electrode of the driving transistor being coupled to a high voltage level terminal, a cathode of the light emitting element being coupled to a low voltage level terminal, wherein the driving and compensation circuit is configured to drive light emission of the light emitting element under drive of a data voltage and to compensate for a threshold voltage of the driving transistor, the detection circuit is configured to detect a value of the threshold voltage based on a reference voltage, and wherein the pixel driving device further comprises a reference voltage adjustment circuit coupled to the detection circuit and configured to adjust the reference voltage to generate a second reference voltage such that the driving and compensation circuit generates a driving current for driving light emission of the light emitting element based on the second reference voltage.

9. The pixel driving device of claim 8, wherein the threshold voltage of the driving transistor negatively drifts, the reference voltage has a positive value, and the second reference voltage is less than the reference voltage and greater than 0.

10. The pixel driving device of claim 8, wherein the reference voltage adjustment circuit comprises an adjustment sub-circuit configured to receive the data voltage and adjust the reference voltage based on the data voltage to generate the second reference voltage.

11. The pixel driving device of claim 10, wherein the reference voltage adjustment circuit further comprises a storage configured to store a value of the reference voltage; and the adjustment sub-circuit is configured to adjust the reference voltage based on the stored value of the reference voltage and the data voltage to generate the second reference voltage.

12. The pixel driving device of claim 11, wherein the second reference voltage decreases as the data voltage increases.

13. The pixel driving device of claim 11, wherein the reference voltage adjustment circuit further comprises a selecting sub-circuit configured to select one function among a plurality of preset functions based on the stored value of the reference voltage, and the adjustment sub-circuit is configured to adjust the reference voltage based on the data voltage and the one function to generate the second reference voltage.

14. The pixel driving device of claim 8, wherein the light emitting element is an organic light emitting diode.

15. A display apparatus, comprising the pixel driving device of claim 8.

16. The display apparatus of claim 15, wherein the display apparatus is an organic light emitting diode display apparatus.

* * * * *